United States Patent
Aoki et al.

(10) Patent No.: US 8,750,052 B2
(45) Date of Patent: Jun. 10, 2014

(54) SEMICONDUCTOR STORAGE DEVICE

(75) Inventors: Satoshi Aoki, Nagareyama (JP); Kazuo Hatakeyama, Tokyo (JP); Yasushi Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 13/370,701

(22) Filed: Feb. 10, 2012

(65) Prior Publication Data

US 2012/0206976 A1 Aug. 16, 2012

(30) Foreign Application Priority Data

Feb. 14, 2011 (JP) ................................. 2011-028696

(51) Int. Cl.
*G11C 16/04* (2006.01)
(52) U.S. Cl.
USPC ................................. 365/185.29; 365/185.09
(58) Field of Classification Search
USPC .............. 365/185.29, 185.09, 185.17, 185.18
See application file for complete search history.

(56) References Cited

U.S. PATENT DOCUMENTS

2011/0197045 A1* 8/2011 Okamoto ....................... 711/166
2012/0002475 A1* 1/2012 Ueno et al. ................ 365/185.11

FOREIGN PATENT DOCUMENTS

JP 2005-122800 5/2005

* cited by examiner

*Primary Examiner* — Vu Le
(74) *Attorney, Agent, or Firm* — Oblon, Spivak, McClelland, Maier & Neustadt, L.L.P.

(57) ABSTRACT

A memory includes a sense amplifier connected to one or more of bit lines and configured to sense data stored in the memory cells; and a word line driver configured to control a voltage of one or more of word lines. The memory cells constitute a memory block. The memory cells constitute a memory block being a unit of memory cells on which a data erasing operation is performed. A controller changes an erase condition during the data erasing operation performed on the memory block or a verify condition for a verify check of verifying whether the data has been erased from the memory cells in the memory block, in proportion to a ratio of number of predetermined logical value data to the data in the memory block or the page before the data erasing operation.

14 Claims, 7 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2011-28696, filed on Feb. 14, 2011, the entire contents of which are incorporated herein by reference.

FIELD

The embodiments of the present invention relate to a semiconductor storage device.

BACKGROUND

An EEPROM (hereinafter, also simply "memory") such as a NAND flash memory performs a data erasing operation on every memory cell block. In the data erasing operation, the memory erases data stored in memory cells included in a memory cell block by extracting a charge from floating gates of the memory cells.

An erase verify check is conducted to verify whether data has been erased. In the erase verify check, a voltage is applied to a cell string in each column and it is determined whether a current flows to the cell string so as to make verification. When no current flows to the cell string in the erase verify check, it is necessary to perform the data erasing operation again. That is, after repeating an erase loop of erasure and verification to erase data, the current sufficiently flows to cell strings in all columns in the erase verify check. To make the entire memory cell blocks including many memory cells into an erasure state, it is normally necessary to repeat the erase loop for a plurality of times.

However, when the number of memory cells in a charge accumulated state (for example, "0" cells storing data "0") is small and the number of memory cells in a data erased state (for example, "1" cells storing data "1") is large in a certain memory cell block, the memory cell block possibly and erroneously passes the erase verify check even if the memory cells from which data is insufficiently erased are present therein. This phenomenon is often referred to as "data '1' defect".

DETAILED DESCRIPTION

Figure 1:
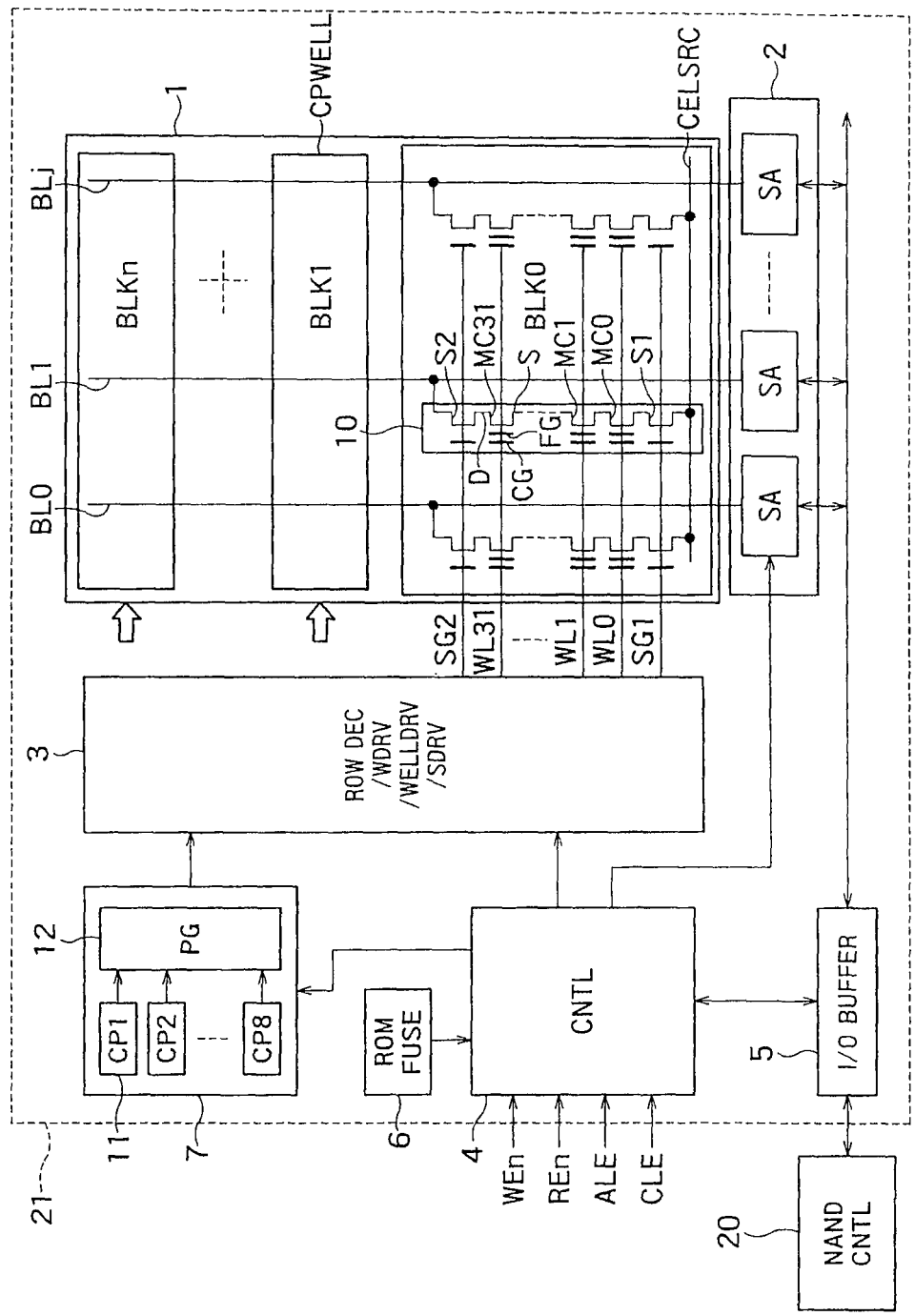
FIG. 1 is a block diagram showing configurations of a NAND flash memory 21 and a control circuit 20 according to a first embodiment.

A semiconductor storage device according to the present embodiment comprises a plurality of bit lines; a plurality of word lines crossing the bit lines; a plurality of memory cells respectively provided to correspond to intersections between the bit lines and the word lines; a sense amplifier connected to one or more of the bit lines and configured to sense data stored in the memory cells; and a word line driver configured to control a voltage of one or more of the word lines. A plurality of the memory cells constitute a memory block. The memory cells constitute a memory block being a unit of memory cells on which a data erasing operation is performed. A controller is configured to change an erase condition during the data erasing operation performed on the memory block or a verify condition for a verify check of verifying whether the data has been erased from the memory cells in the memory block, in proportion to a ratio of number of predetermined logical value data to the data in the memory block or the page before the data erasing operation.

Embodiments will now be explained with reference to the accompanying drawings. The present invention is not limited to the embodiments.

First Embodiment

Data "1" defect is explained first.

For example, when the number of memory cells in a charge accumulated state (for example, "0" cells storing data "0") is small in the same page arranged in a word line direction, a memory cell block including the page often passes the erase verify check after a very small number of erase loops. For example, when only one memory cell is in the charge accumulated state among those commonly connected to a certain word line and the other memory cells are in a data erased state from the beginning, it suffices that only the memory cell in the charge accumulated state passes the erase verify check. That is, it suffices that only the memory cell in the charge accumulated state passes the erase verify check after a small number of erase loops. Therefore, in this case, a threshold voltage of the memory cell in the charge accumulated state is not sufficiently transitioned to a voltage corresponding to the data erased state.

As another example, when many memory cells are in the data erased state and only a few memory cells are in an insufficient data erased state in cell strings in a bit line direction in the erase verify check, a relatively large amount of cell current flows to the cell strings and the memory cell block, therefore, tend to pass the erase verify check.

Therefore, when the number of memory cells in the charge accumulated state (for example, "0" cells storing data "0") is small and the number of memory cells in the data erased state (for example, "1" cells storing data "1") is large or particularly when the number of memory cells in the charge accumulated state ("0" cells) is small in the pages in the word line direction and the number of memory cells in the data erased state ("1" cells) is large in the cell strings in the bit line direction, the memory cell block possibly passes the erase verify check even if the memory cells in the insufficient data erased state are present.

This disadvantageously results in erasing error. Generally, the memory cells from which data has been erroneously erased are relieved by an ECC (Error Correction Code) or the like. However, when the number of defective cells increases, it is disadvantageously necessary to set the ECC to be able to relieve more defective cells. This decelerates the operating speed of the semiconductor storage device.

FIG. 1 is a block diagram showing configurations of a NAND flash memory (hereinafter, also simply "memory") 21 and a control circuit (a NAND controller, for example) 20 according to a first embodiment. The memory 21 includes a memory cell array 1, a sense amplifier circuit 2, a row decoder (including a word line driver WDRV, a well driver WELLDRV, and a source line driver SDRV) 3, a control unit 4, an input/output (hereinafter, also simply "I/O") buffer 5, a ROM fuse 6, and a voltage generation circuit 7. The memory 21 is constituted as one chip (hereinafter, therefore, the chip is often referred to as "memory chip 21") and that the NAND controller 20 controls a plurality of memory chips 21. The NAND controller 20 and the memory chips 21 are integrally sealed with resin.

The memory cell array 1 includes a plurality of memory cells MC arranged two-dimensionally in a matrix shape. Each NAND string (hereinafter, also "cell string") 10 includes a plurality of memory cells MC (MC0, MC1, ..., and MC31) connected in series and select gate transistors S1 and S2 connected to both ends of the NAND string 10, respectively. A source of the select gate transistor S1 is connected to a common source line CELSRC and a drain of the select gate transistor S2 is connected to a bit line BL. The select transistors S1 and S2 are configured to electrically connect or disconnect the memory cells MC in the cell string 10 to or from one another between the bit line BL and the common source line CELSRC.

A plurality of cell strings 10 are arranged in an extending direction of word lines WL and constitute a memory cell block (hereinafter, also simply "block") BLK. The block BLK is a unit of memory cells MC on which a data erasing operation is performed at a time simultaneously. Each block BLK includes a plurality of pages. The page is a unit of memory cells on which a data writing operation or a data reading operation is performed at a time simultaneously. Each page includes a plurality of memory cells MC commonly connected to a certain word line WL.

Each memory cell MC includes a gate dielectric film (a tunnel dielectric film) formed between a drain D and a source S and a floating gate FG provided on the gate dielectric film and serving as a charge accumulating layer. The memory cell MC also includes a control gate CG provided above the floating gate FG via an inter-gate dielectric film. The control gate CG is connected to one of the word lines WL.

The control gates CG of the memory cells MC in each cell string 10 are connected to different word lines WL (WL0, WL1, ..., and WL31), respectively. Gates of the select gate transistors S1 and S2 are connected to select gate lines SG1 and SG2 in parallel to the word lines WL, respectively. As described, a group of memory cells MC sharing one word line WL constitutes one page. A group of cell strings 10 sharing the word lines WL and the select gate lines SG1 and SG2 constitute one block BLK.

As shown in FIG. 1, the memory cell array 1 includes a plurality of blocks BLK (BLK0, BLK1, ..., and BLKn) in the bit line direction. A P-well CPWELL is formed on a silicon substrate to correspond to each block BLK. That is, the memory cells MC in one block BLK are formed on the same P-well CPWELL in a semiconductor substrate.

The sense amplifier circuit 2 includes a plurality of sense amplifiers SA. Each sense amplifier SA is connected to one bit line BL and senses read data transmitted via the bit line BL. Each sense amplifier SA includes a page buffer that holds write data received from an external device so as to write the write data to the memory cells MC via the bit line BL.

The sense amplifier circuit 2 includes a column select gate, and the column select gate can selectively connect one of the sense amplifiers SA to the corresponding bit line BL. The word line driver WDRV selects and drives word lines WL and one pair of select gate lines SG1 and SG2.

The row decoder 3 selects word lines WL, one P-well CPWELL, and one common source line CELSRC in response to a row address. As described above, the row decoder 3 includes the word line driver WDRV, the well driver WELLDRV, and the source line driver SDRV. The word line driver WDRV can apply a voltage to the selected word lines WL, the well driver WELLDRV can apply a voltage to the selected P-well CPWELL, and the source line driver SDRV can apply a voltage to the selected common source line CELSRC.

The input/output buffer 5 transmits or receives data to or from the sense amplifier circuit 2 or external input/output terminals, and further receives command data and address data. The control unit 4 controls overall memory operations in response to external control signals such as a write enable signal WEn, a read enable signal REn, an address latch enable signal ALE, and a command latch enable signal CLE.

Specifically, the control unit 4 includes a command interface, an address holding circuit, a transfer circuit, and the like, and determines whether supplied data is write data or address data. When a determination result indicates that the supplied data is the write data, the control unit 4 transfers the write data to the sense amplifier circuit 2. When the determination result indicates that the supplied data is the address data, the control unit 4 transfers the address data to the row decoder 3 or the sense amplifier circuit 2.

Furthermore, the control unit 4 exerts controls such as a sequence control over a data reading operation, a data writing operation, and a data erasing operation and a control over applied voltages for those operations in response to the external control signals.

The voltage generation circuit 7 includes a plurality of booster circuits 11 and a pulse generating circuit 12. The booster circuits 11 can be configured to include well-known charge pump circuits CP (CP1 to CP8), respectively. The voltage generation circuit 7 changes over the number of the booster circuits 11 to be driven in response to the control signal from the control unit 4. The voltage generation circuit 7 also controls the pulse generating circuit 12 to adjust, for example, a pulse width or a pulse height of a pulse voltage.

The pulse widths and pulse heights of pulse voltages for the data writing operation and the data erasing operation can be stored in, for example, the ROM fuse 6 shown in FIG. 1 as voltage setting data. The control unit 4 can determine the number of the booster circuits 11 to be driven on the basis of this voltage setting data.

The input/output buffer 5 communicably connects the memory 21 to the NAND controller 20. The NAND controller 20 is configured to calculate the number of data "0" or "1" in the pages before data erasure, and to change erasure conditions during the data erasing operation performed on a target block BLK or verification conditions for verifying whether data has been erased from the memory cells MC in the block BLK.

Figure 2:
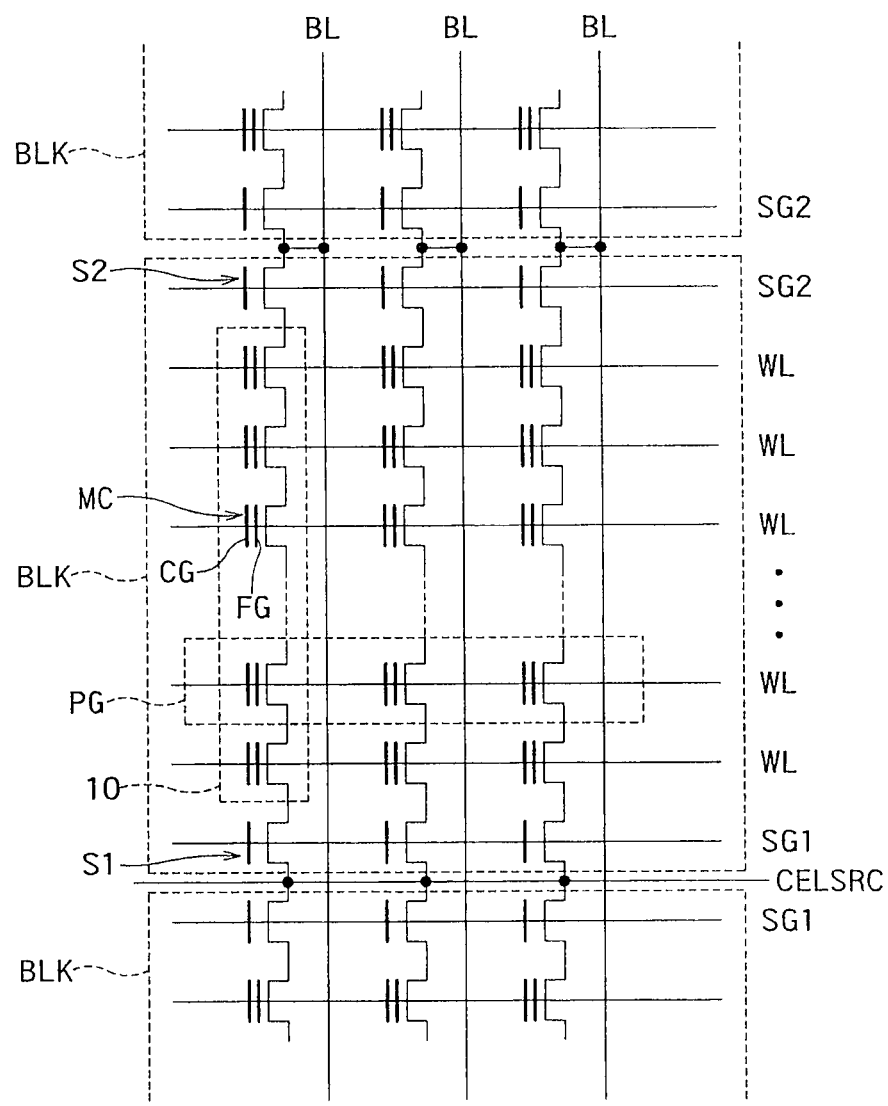
FIG. 2 is a partial configuration diagram showing an exemplary partial configuration of the memory cell array 1.

FIG. 2 is a partial configuration diagram showing an exemplary partial configuration of the memory cell array 1. As described above, the memory cell array 1 includes the memory cells MC arranged two-dimensionally in a matrix shape. The word lines WL and the bit lines BL extend in directions orthogonal to each other. The memory cells MC are provided to correspond to intersections between the word lines WL and the bit lines BL, respectively. Each memory cell MC is an FET including the floating gate FG that can accumulate charge and the control gate CG connected to one word line WL.

A plurality of memory cells MC are connected in series and constitute one cell string 10. The cell string 10 is connected to one bit line BL via the select transistor S2 on a drain D side of the memory cells MC. The cell string 10 is also connected to the common source line CELSRC via the select transistor S1 on a source S side of the memory cells MC. As described above, the control gates CG of the memory cells MC in the cell string 10 are connected to the different word lines WL, respectively.

As described above, a plurality of cell strings 10 arranged in the extending direction of the word lines WL constitute one block BLK. As described above, the block BLK is the unit of memory cells MC on which a data erasing operation is performed simultaneously. Furthermore, a plurality of memory cells MC commonly connected to a certain word line WL in each memory cell block BLK constitute one page. As described above, the page is the unit of memory cells MC on which a data writing operation or a data reading operation is performed simultaneously.

The data erasing operation is described next. Normally, the data erasing operation is performed by repeating a plurality of erase loops. Each erase loop includes a charge extracting operation of extracting charge from the memory cells MC in the block BLK and an erase verify check (hereinafter, also simply "verify check") of verifying whether data has been erased.

[Charge Extracting Operation]

In the charge extracting operation, the word line driver WDRV fixes a voltage of the word lines WL in the erasing target block BLK to a ground voltage, and the well driver WELLDRV then applies an erase voltage to the P-well CPWELL in which the erasing target block BLK is formed. For example, the memory cells MC are N-type FET (Field Effect Transistors) and the charge accumulated in the floating gates FG is electrons. In this case, the word line driver WDRV fixes the voltage of the word lines WL in the erasing target block BLK to 0 volt, and the well driver WELLDRV then applies the erase voltage of, for example, 17 volts to the corresponding P-well CPWELL. The electrons accumulated in the memory cells MC in the erasing target block BLK are thereby extracted and data stored in the memory cells MC is thereby erased.

[Erase Verify Check]

In the verify check, after the charge extracting operation, the word line driver WDRV fixes the voltage of the word lines WL in the erasing target block BLK to the ground voltage, and the well driver WELLDRV then applies a voltage to the P-well CPWELL. At this time, the sense amplifier circuit 2 senses the voltage of the bit lines BL via the cell strings 10 and determines whether the data has been erased from the memory cells MC in the respective cell strings 10.

Figure 3:
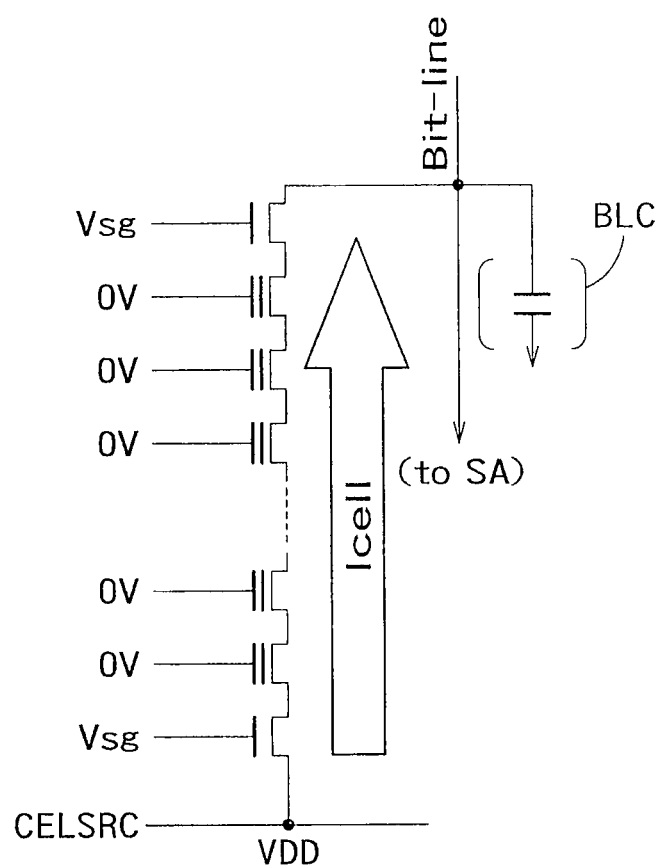
FIG. 3 is a conceptual diagram showing operations in the erase verify check.

FIG. 3 is a conceptual diagram showing operations in the erase verify check. FIG. 3 shows only one cell string 10 for the sake of convenience. As described above, in the verify check, the word line driver WDRV applies the voltage of the word lines WL in the erase verify target block BLK to the ground voltage (for example, 0 volt). The source line driver SDRV applies a high level voltage VDD to the common source line CELSRC. The sense amplifier circuit 2 senses a change in the voltage of the bit line BL, thereby verifying whether the data has been erased from the memory cells MC in the cell string 10. In FIG. 3, reference character BLC indicates a capacitance of the corresponding bit line BL, for example, a capacitance between the bit line BL and the adjacent bit line BL.

When data is sufficiently erased from all the memory cells MC in the cell string 10, the threshold voltages of the memory cells MC are sufficiently lower than the ground voltage. Therefore, a cell current Icell flows to the cell string 10, the capacitance BLC of the bit line BL is charged, and the voltage of the bit line BL becomes higher than a reference voltage VSENEV within a specified time. The sense amplifier circuit 2 detects the voltage of the bit line BL, thereby making it possible to determine whether the voltage of the bit line BL is higher than the reference voltage VSENEV. The reference voltage VSENEV is compared with the voltage of the bit line BL so as to determine whether the memory cells MC in the cell string 10 are in the data erased state.

On the other hand, when the data is not sufficiently erased from one of the memory cells MC in the cell string 10, the threshold voltage of the memory cell MC is either closer to or higher than the ground voltage. Therefore, it becomes difficult for the cell current Icell to flow to the cell string 10, and it takes a longer time until the voltage of the bit line BL rises or the voltage of the bit line BL does not rise. As a result, the voltage of the bit line BI does not become higher than the reference voltage VSENEV within the specified time.

In this manner, the memory 21 can determine whether the memory cells MC are in the data erased state by comparing the reference voltage VSENEV with the voltage of the bit line BL.

Figure 4:
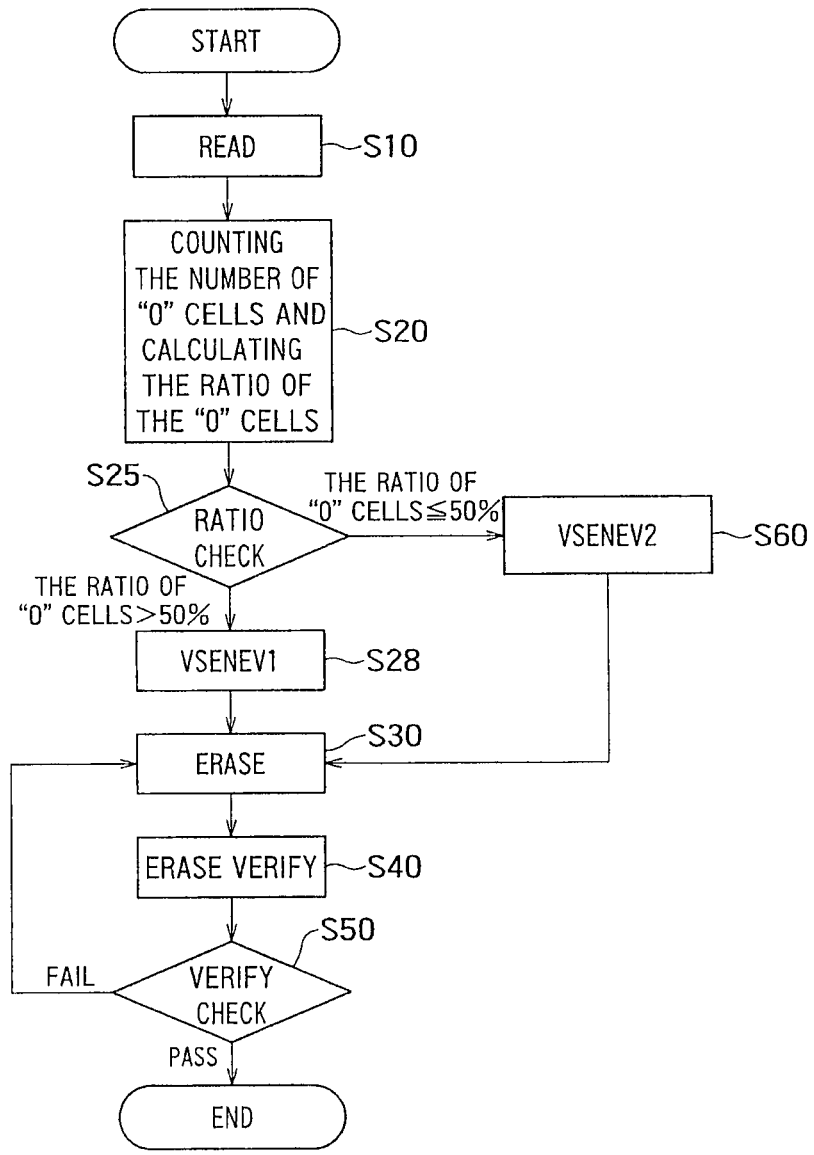
FIG. 4 is a flowchart showing a data erasing operation performed by the memory 21 and the NAND controller 20 according to the first embodiment.

FIG. 4 is a flowchart showing a data erasing operation performed by the memory 21 and the NAND controller 20 according to the first embodiment. In the first embodiment, the NAND controller 20 changes verification conditions in proportion to a ratio of the number of predetermined logical value data to all the data in the block BLK or each page.

In the first embodiment, the number of "0" cells or "1" cells calculated before the data erasing operation, the ratio of the number of "0" cells or "1" cells to that of memory cells MC in the page before the data erasing operation, the well voltage applied to the P-well CPWELL during the data erasing operation, the time required for applying the well voltage during the data erasing operation, the reference voltage compared with the voltage of the bit line BL during the erase verify check after the data erasing operation, a source voltage applied to the common source line CELSRC during the erase verify check after the data erasing operation, and the ground voltage can be all stored in the ROM fuse 6. In the first embodiment, the data stored in the memory cell MC in a charge accumulated state is referred to as "data "0"", and the data stored in the memory cell MC in a data erased state is referred to as "data "1"". Furthermore, the memory cell MC storing data "0" is referred to as ""0" cell" and that storing data "1" is referred to as ""1" cell".

First, the sense amplifier circuit 2 reads data from the erasing target block BLK (S10). The sense amplifier circuit 2 outputs the read data to the NAND controller 20 via the I/O buffer 5.

The NAND controller 20 counts the "0" cells or "1" cells and calculates the ratio of the number of logical value data to that of data in either the entire block BLK or each page (S20). For example, the NAND controller 20 counts the "0" cells and calculates the ratio of the number of "0" cells to that of memory cells MC in the entire block BLK or each page. Needless to say, the NAND controller 20 can count the "1" cells and calculates the ratio of the number of "1" cells to that of memory cells MC in the entire block BLK or each page.

The NAND controller 20 checks the ratio of the number of "0" cells (S25). When the ratio of the number of "0" cells to that of memory cells MC in the entire block BLK or each page exceeds a predetermined value (50% in this example), the NAND controller 20 transmits a command to select a first reference voltage VENEV1 to the memory 21 (S28). The memory 21 performs the data erasing operation as usual using the first reference voltage VSENEV1 (S30 to S50).

For example, the ROM 6 stores the first reference voltage VSENEV1 in advance. When the ratio of the number of "0"

cells exceeds 50%, the NAND controller 20 transmits the command to select the first reference voltage VSENEV1 (for example, 0.35 V) to the memory 21 (S28).

The memory 21 selects the first reference voltage VSENEV1 in response to the command from the NAND controller 20. The memory 21 performs the charge extracting operation (S30) and then conducts the erase verify check using the first reference voltage VSENEV1 (S40). The predetermined value changes depending on characteristics of the semiconductor storage device, that is, memory 21 itself or on a data pattern or the like in proportion to actual usage circumstances of the memory 21. That is, the ratio of the number of "0" cells can be changed within a range from 0% to 100%. Furthermore, the predetermined value or the reference voltage can be rewritten outside of the memory chip 21 and the NAND controller 20.

When a result of the verify check indicates that the voltage of one of the bit lines BL in the erasing target block BLK is lower than the first reference voltage VSENEV1 ("Fail", S50), this means that the block BLK includes the memory cell MC from which data has been insufficiently erased.

Accordingly, the memory 21 performs the erase loop again at Steps S30 to S40. The memory 21 repeatedly performs the erase loops until the cell strings 10 in all the columns of the erasing target block BLK pass the erase verify check. The erase verify check in each erase loop uses the first reference voltage VSENEV1. When all the cell strings 10 in the erasing target block BLK pass the verify check ("Pass", S50), the memory 20 finishes the data erasing operation.

On the other hand, when the ratio of the number of "0" cells to that of memory cells MC in the entire block BLK or each page is equal to or lower than 50% (S25), the NAND controller 20 transmits a command to select a second reference voltage VSENEV2 (for example, 0.40 V) that is higher than the first reference voltage VSENEV1 to the memory 21 (S60). The memory 21 performs the data erasing operation using the second reference voltage VSENEV2 (S30).

For example, the ROM 6 stores not only the first reference voltage VSENEV1 but also the second reference voltage VSENEV2, which is higher than the first reference voltage VSENEV1. When the ratio of the number of "0" cells is equal to or lower than 50%, the NAND controller 20 transmits the command to select the second reference voltage VSENEV2 to the memory 21 (S60). The memory 21 selects the second reference voltage VSENEV2 in response to the command from the NAND controller 20. The memory 21 performs the charge extracting operation (S30) and then conducts the erase verify check using the second reference voltage VSENEV2 (S40). The memory 21 repeatedly performs the erase loops until the cell strings 10 in all the columns of the erasing target block BLK pass the erase verify check. The erase verify check in each erase loop uses the second reference voltage VSENEV2. When all the cell strings 10 in the erasing target block BLK pass the verify check ("Pass", S50), the memory 20 finishes the data erasing operation.

When the ratio of the number of "0" cells to that of memory cells MS in the entire block BLK or each page exceeds the predetermined value (50%), the number of "1" cells is small and it is relatively difficult that the "data "1" defect" explained above occurs. This is because the data "1" defect tends to occur when many "1" cells are present in the pages in the word line direction and many "1" cells are present in the cell strings 10 in the bit line direction. Therefore, in this case, it suffices to use the first reference voltage VSENEV1 as the reference voltage to be compared with the voltage of the bit lines BL.

On the other hand, when the ratio of the number of "0" cells to that of memory cells MC in the entire block BLK or the entire page is equal to or lower than the predetermined value (50%), the number of "1" cells is large, which creates a state where the data "1" defect explained above occurs relatively easily. Therefore, in this case, the second reference voltage VSENEV2 is used as the reference voltage to be compared with the voltage of the bit lines BL. It is more difficult for the memory cells MC to pass the erase verify check using the second reference voltage VSENEV2 because the second reference voltage VSENEV2 is higher than the first reference voltage VSENEV1. This can suppress the cell string 10 including the memory cell MC from which data has been insufficiently erased from passing the erase verify check after the data erasing operation at Step S30, and can increase the number of times of performing the erase loops. As a result, the occurrence of the data "1" defect is made more difficult.

As described above, the semiconductor storage device according to the first embodiment can suppress insufficient data erasing for the data stored in the memory cells MC in the data erasing operation without dependence on the data pattern (such as a data logical value bias or a distribution of data logical values).

Moreover, "1" cells are not excessively erased because an erase voltage VERA is not changed depending on the number of "1" cells. This can prevent the excessively-erased "1" cells from causing a change in the threshold voltages of the adjacent memory cells MC.

Second Embodiment

Figure 5:
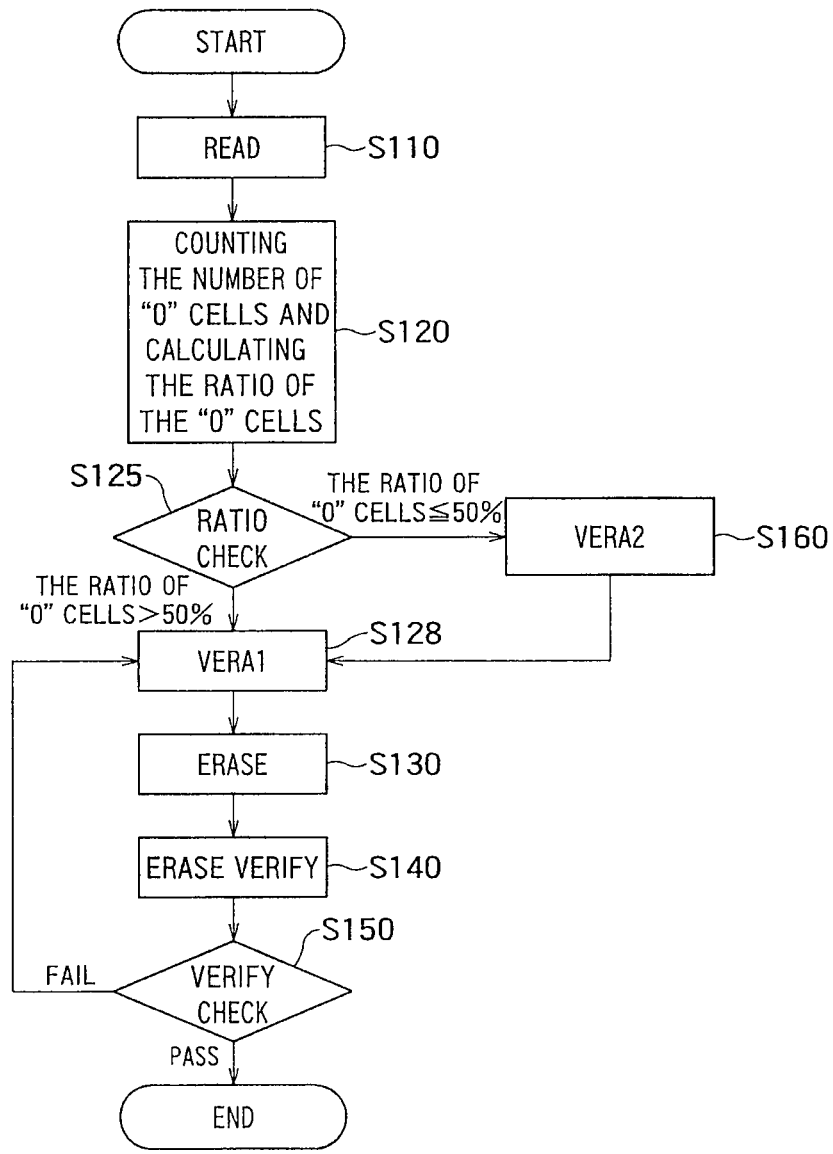
FIG. 5 is a flowchart showing a data erasing operation performed by the memory 21 and the NAND controller 20 according to a second embodiment.

FIG. 5 is a flowchart showing a data erasing operation performed by the memory 21 and the NAND controller 20 according to a second embodiment. Configurations of the memory 21 and the NAND controller 20 according to the second embodiment can be identical to corresponding ones of the first embodiment.

In the second embodiment, the NAND controller 20 changes conditions for the charge extracting operation in proportion to the ratio of the number of predetermined logical value data to that of all the data in the block BLK or each page.

First, the sense amplifier circuit 2 reads data from the erasing target block BLK (S110). The sense amplifier circuit 2 outputs the read data to the NAND controller 20 via the I/O buffer 5.

The NAND controller 20 counts the "0" cells or "1" cells and calculates the ratio of the number of data "0" or "1" to all the data in either the entire block BLK or each page (1S20). For example, the NAND controller 20 counts the "0" cells and calculates the ratio of the number of the "0" cells to that of the memory cells MC in the entire block BLK or each page.

The NAND controller 20 checks the ratio of the number of "0" cells (S125).

When the ratio of the number of "0" cells to that of memory cells MC in the entire block BLK or each page exceeds a predetermined value (50% in this example), the NAND controller 20 transmits a command to select a first erase voltage VERA1 (for example, 15 V) to the memory 21 (S128). The memory 21 performs the data erasing operation as usual using the first erase voltage VERA1 (S130 to S150).

For example, the ROM 6 stores the first erase voltage VERA1 in advance. When the ratio of the number of "0" cells exceeds 50%, the NAND controller 20 transmits the command to select the first erase voltage VERA1 to the memory 21 (S128). The memory 21 selects the first erase voltage VERA1 in response to the command from the NAND controller 20. The memory 21 performs the charge extracting operation (S130) using the first erase voltage VERA1 and then conducts the erase verify check (S140). The first erase voltage VERA1 is a voltage applied to the P-well CPWELL during the charge extracting operation. In the second embodiment, a reference voltage during the verify check is constant VSENEV (for example, 3.5 V).

In the charge extracting operation at Step S130, the well driver WELLDRV applies the first erase voltage VERA1 to the P-well CPWELL corresponding to the erasing target block BLK. At this time, the word line driver WDRV fixes the voltage of the word lines WL in the erasing target block BLK to the ground voltage (for example, 0 volt).

When a result of the verify check indicates that the voltage of one of the bit lines BL in the erasing target block BLK is lower than the reference voltage VSENEV ("Fail", S150), this means that the block BLK includes the memory cell MC from which data has been insufficiently erased. Accordingly, the memory 21 performs the erase loop again at Steps S130 to S140. The memory 21 repeatedly performs the erase loops until the cell strings 10 in all the columns of the erasing target block BLK pass the erase verify check. The erase verify check in each erase loop uses the first erase voltage VERA1. When all the cell strings 10 in the erasing target block BLK pass the verify check ("Pass" in S150), the memory 20 finishes the data erasing operation.

On the other hand, when the ratio of the number of "0" cells to that of memory cells MC in the entire block BLK or each page is equal to or lower than 50% (S125), the NAND controller 20 transmits a command to select a second erase voltage VERA2 (for example, 16 V) that is higher than the first erase voltage VERA1 to the memory 21 (S160). The memory 21 performs the data erasing operation using the second erase voltage VERA2 (S130).

For example, the ROM 6 stores not only the first erase voltage VERA1 but also the second erase voltage VERA2, which is higher than the first erase voltage VERA1. When the ratio of the number of "0" cells is equal to or lower than 50%, the NAND controller 20 transmits the command to select the second erase voltage VERA2 to the memory 21 (S160). The memory 21 selects the second erase voltage VERA2 in response to the command from the NAND controller 20. The memory 21 performs the charge extracting operation using the second erase voltage VERA2 (S130) and then conducts the erase verify check (S140). The memory 21 repeatedly performs the erase loops until the cell strings 10 in all the columns of the erasing target block BLK pass the erase verify check. The erase verify check in each erase loop uses the second erase voltage VERA2.

When all the cell strings 10 in the erasing target block BLK pass the verify check ("Pass", S150), the memory 20 finishes the data erasing operation.

When the ratio of the number of "0" cells to that of memory cells MC in the entire block BLK or the entire page is equal to or lower than the predetermined value (50%), the number of "1" cells is large, which creates a state where the data "1" defect explained above occurs relatively easily. Therefore, in this case, the second erase voltage VERA2 is used as the cell well voltage during the charge extracting operation. The second erase voltage VERA2 is higher than the first erase voltage VERA1. Accordingly, the charge (electrons) accumulated in the memory cells MC is emitted more easily. Therefore, even if the ratio of the number of "1" cells is high in the block BLK or each page, the data erasing operation at Step S130 can sufficiently erase the data stored in the memory cells MC. As a result, the occurrence of the data "1" defect is made more difficult. Therefore, the second embodiment can achieve effects identical to those of the first embodiment.

Third Embodiment

Figure 6:
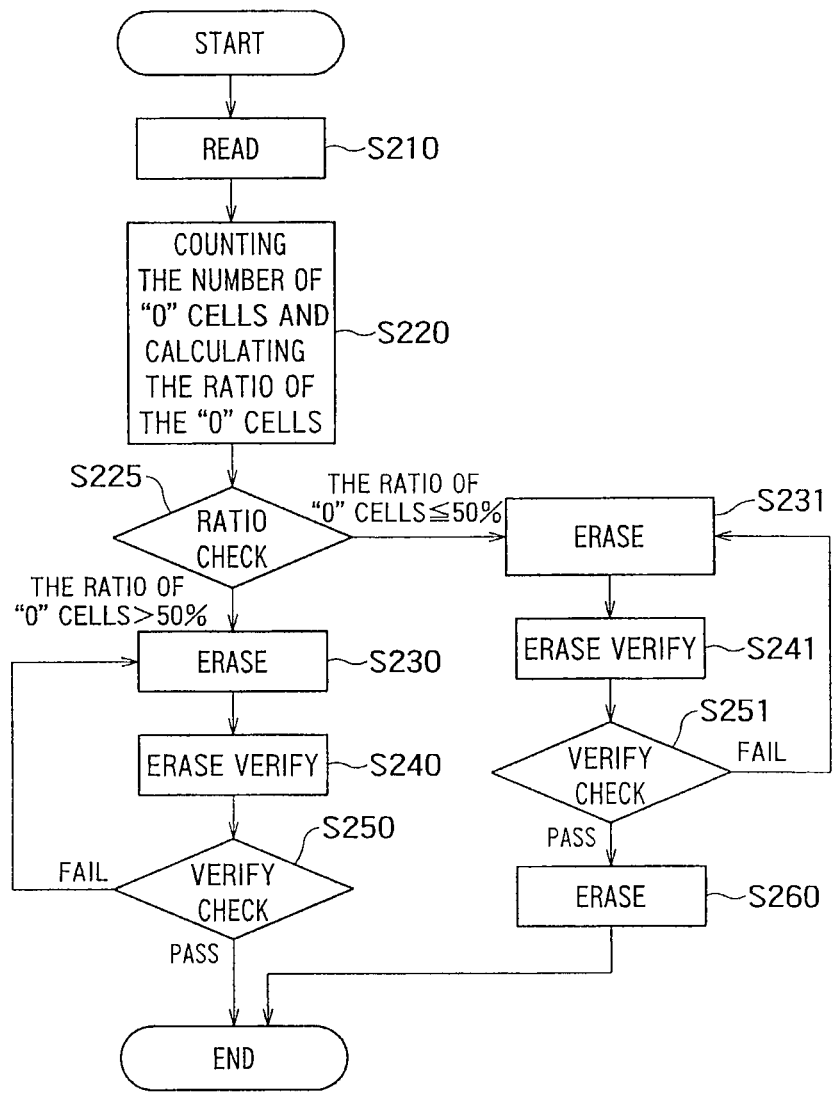
FIG. 6 is a flowchart showing a data erasing operation performed by the memory 21 and the NAND controller 20 according to a third embodiment.

FIG. 6 is a flowchart showing a data erasing operation performed by the memory 21 and the NAND controller 20 according to a third embodiment. Configurations of the memory 21 and the NAND controller 20 according to the third embodiment can be identical to corresponding ones of the first embodiment.

In the third embodiment, the memory 21 performs the charge extracting operation and the verify check in proportion to the ratio of the number of predetermined logical value data to that of all the data in the block BLK or each page, and then performs another charge extracting operation.

First, the sense amplifier circuit 2 reads data from the erasing target block BLK (S210). The sense amplifier circuit 2 outputs the read data to the NAND controller 20 via the I/O buffer 5.

The NAND controller 20 counts the "0" cells or "1" cells and calculates the ratio of the number of logical value data to that of data in either the entire block BLK or each page (S220). For example, the NAND controller 20 counts the "0" cells and calculates the ratio of the number of "0" cells to that of memory cells MC in the entire block BLK or each page.

The NAND controller 20 checks the ratio of the number of "0" cells (S225).

When the ratio of the number of "0" cells to that of memory cells MC in the entire block BLK or each page exceeds a predetermined value (50% in this example), the memory 21 performs the data erasing operation as usual. That is, the memory 21 performs the charge extracting operation (S230) and the verify check (S240).

When a result of the verify check indicates that the voltage of one of the bit lines BL in the erasing target block BLK is lower than the reference voltage VSENEV (for example, 3.5 V) ("Fail", S250), the memory 21 performs the erase loop again at Steps S230 to S240. The memory 21 repeatedly performs the erase loops until the cell strings 10 in all the columns of the erasing target block BLK pass the verify check. When all the cell strings 10 in the erasing target block BLK pass the verify check ("Pass", S250), the memory 20 finishes the data erasing operation.

On the other hand, when the ratio of the numbers of "0" cells to that of all the memory cells MC in the entire block BLK or each page is equal to or lower than 50% (S225), the NAND controller 20 transmits a command to perform the charge extracting operation again after the block BLK passes the verify check to the memory 21. The memory 21 performs the data erasing operation in response to the command from the NAND controller 20. That is, the memory 21 performs the charge extracting operation (S231) and conducts the verify check (S241). An erase loop at Steps S231 and S241 is the same as that at Steps S230 and S240, respectively.

The memory 21 repeatedly performs the erase loops until the cell strings 10 in all the columns of the erasing target block BLK pass the verify check. When all the cell strings 10 in the erasing target block BLK pass the verify check ("Pass", S251), the memory 20 performs the charge extracting operation again (S260). This is intended to sufficiently erase the data from the memory cells MC from which data has been insufficiently extracted because of the data "1" WL defect.

After the end of the charge extracting operation, the memory 21 finishes the data erasing operation.

In the third embodiment, in the state where data "1" defect occurs relatively easily, the memory 21 performs the charge extracting operation again after the block BLK passes the verify check. With this configuration, the data stored in the memory cells MC in the erasing target block BLK can be sufficiently erased similarly to the first and second embodiments. As a result, the occurrence of the data "1" defect is made more difficult. Therefore, the third embodiment can also achieve effects identical to those of the first embodiment.

Furthermore, even if the cell string 10 including the memory cell MC from which data is insufficiently erased erroneously passes the verify check, the memory cell MC from which the data is insufficiently erased can be sufficiently erased by another charge extracting operation (S260).

Fourth Embodiment

Figure 7:
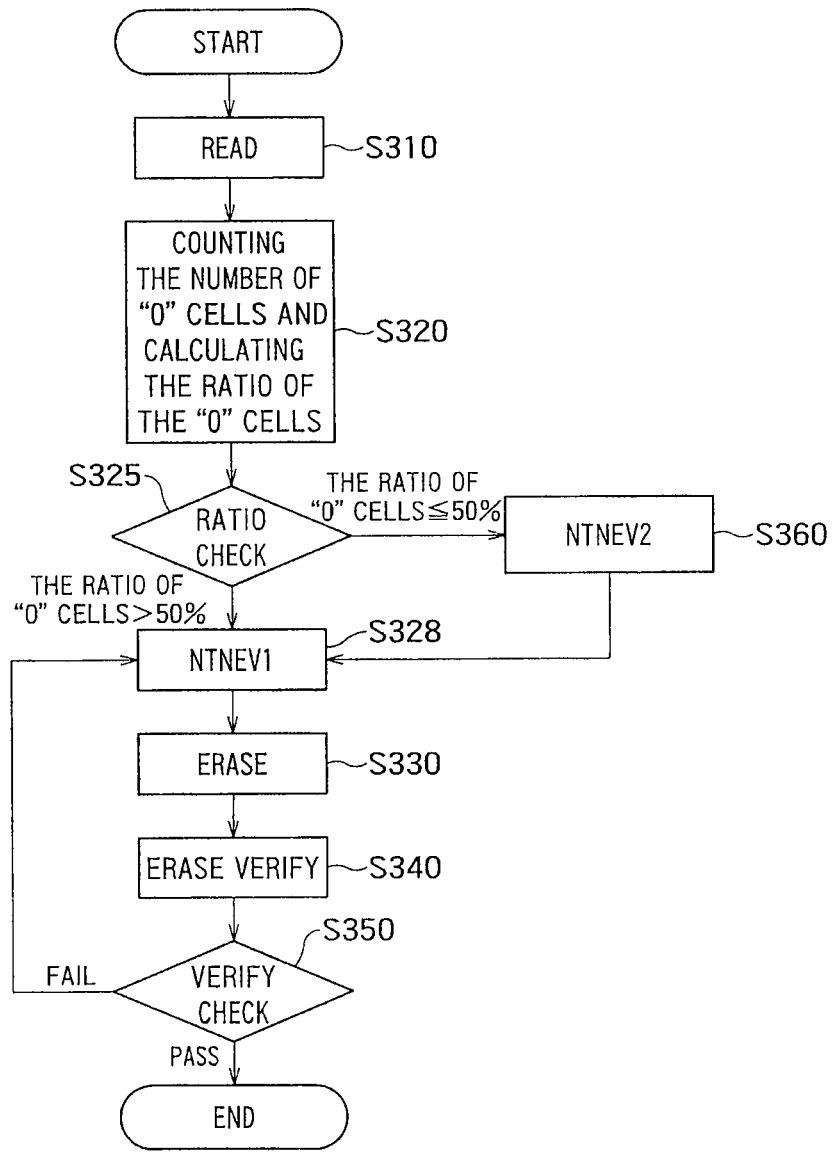
FIG. 7 is a flowchart showing a data erasing operation performed by a memory 21 and the NAND controller 20 according to the fourth embodiment.

FIG. 7 is a flowchart showing a data erasing operation performed by a memory 21 and the NAND controller 20 according to the fourth embodiment. Configurations of the memory 21 and the NAND controller 20 according to the fourth embodiment can be identical to corresponding ones of the first embodiment.

In the fourth embodiment, the NAND controller 20 reduces the time (hereinafter, also "sense time") since the source driver SDRV applies the voltage VDD to the common source line CELSRC until the sense amplifier circuit 2 senses the voltage of the bit line BL in each column, in proportion to a ratio of the number of predetermined logical value data to all the data in the block BLK or each page.

First, the sense amplifier circuit 2 reads data from the erasing target block BLK (S310). The sense amplifier circuit 2 outputs the read data to the NAND controller 20 via the I/O buffer 5.

The NAND controller 20 counts the "0" cells or "1" cells and calculates the ratio of the number of data "0" or "1" to that of data in either the entire block BLK or each page (S320). For example, the NAND controller 20 counts the "0" cells and calculates the ratio of the number of "0" cells to that of memory cells MC in the entire block BLK or each page.

The NAND controller 20 checks the ratio of the number of "0" cells (S325).

When the ratio of the number of "0" cells to that of memory cells MC in the entire block BLK or each page exceeds a predetermined value (50% in this example), the NAND controller 20 transmits a command to select a first sense time NTNEV1 (for example, 7.5 μs) to the memory 21 (S328). The memory 21 performs the data erasing operation as usual using the first sense time NTNEV1 (S330 to S350).

For example, the ROM 6 stores the first sense time NTNEV1 in advance. When the ratio of the number of "0" cells exceeds 50%, the NAND controller 20 transmits the command to select the first sense time NTNEV1 to the memory 21 (S328). The memory 21 selects the first sense time NTNEV1 in response to the command from the NAND controller 20. The memory 21 performs the charge extracting operation (S330) and then conducts the verify check using the first sense time NTNEV1 (S340).

In this verify check, after passage of the first sense time NTNEV1 since the source driver SDRV applies the voltage VDD to the common source line CELSRC, the sense amplifier circuit 2 senses the voltage of the bit line BL in each column.

When a result of the verify check indicates that the voltage of one of the bit lines BL in the erasing target block BLK is lower than the reference voltage VSENEV ("Fail", S350), the memory 21 performs the erase loop again at Steps S330 to S340. The memory 21 repeatedly performs the erase loops until the cell strings 10 in all the columns of the erasing target block BLK pass the erase verify check. The erase verify check in each erase loop uses the first sense time NTNEV1. When all the cell strings 10 in the erasing target block BLK pass the verify check ("Pass", S350), the memory 20 finishes the data erasing operation.

On the other hand, when the ratio of the number of "0" cells to that of memory cells MC in the entire block BLK or each page is equal to or lower than 50% (S325), the NAND controller 20 transmits a command to select a second sense time NTNEV2 (for example, 7.0 μs) that is shorter than the first sense time NTNEV1 to the memory 21 (S360). The memory 21 performs the data erasing operation using the second sense time NTNEV2 (S330).

For example, the ROM 6 stores not only the first sense time NTNEV1 but also the second sense time NTNEV2, which is shorter than the first sense time NTNEV1. When the ratio of the number of "0" cells is equal to or lower than 50%, the NAND controller 20 transmits the command to select the second sense time NTNEV to the memory 21 (S360). The memory 21 selects the second sense time NTNEV2 in response to the command from the NAND controller 20. The memory 21 performs the charge extracting operation (S330) and then conducts the erase verify check using the second sense time NTNEV2 (S340). The memory 21 repeatedly performs the erase loops until the cell strings 10 in all the columns of the erasing target block BLK pass the verify check. The erase verify check in each erase loop uses the second sense time NTNEV2. When all the cell strings 10 in the erasing target block BLK pass the verify check ("Pass", S350), the memory 20 finishes the data erasing operation.

When the data has been sufficiently erased from all the memory cells MC in the cell string 10, the voltage of the bit line BL connected to the cell string 10 rises in a short time in the verify check. On the other hand, when the memory cell MC from which the data has been insufficiently erased is present because of the data "1" WL defect, the voltage of the bit line BL rises in a slightly longer time in the verify check. Therefore, in the state where data "1" defect occurs relatively easily, the verify check uses the relatively a short second sense time NTNEV2, thereby making it difficult for the cell string 10 including the memory cell MC in an insufficient data erased state to pass the verify check. This enables the memory cell 21 to perform the erase loop again on the block BLK, thereby suppressing the occurrence of the data "1" defect. In this manner, the fourth embodiment can also achieve effects identical to those of the first embodiment.

Furthermore, the verify check time can be reduced and the operation speed of the semiconductor storage device can be accelerated.

Two or more of the first to fourth embodiments can be combined. Such a combination can more effectively suppress the occurrence of the data "1" defect. That is, the NAND controller 20 can change two or more of the reference voltage VSENEV, the erase voltage VERA, the sequence of the data erasing operation, and the sense time NTNEV in proportion to the ratio of the number of predetermined logical value data to all the data in the block BLK or each page. It is thereby possible to more effectively handle the data "1" defect.

Furthermore, in the embodiments described above, the semiconductor storage device has been explained while referring to the NAND controller 20 as an example. Alternatively, a control circuit replacing the NAND controller 20 can be provided in the memory 21 and the control circuit can check the ratio of the number of "0" cells (S25, S125, S225, or S325) and change the erase conditions during the data erasing operation (S28, S128, S328, S60, S160, or S360).

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of bit lines;
a plurality of word lines crossing the bit lines;
a plurality of memory cells respectively provided to correspond to intersections between the bit lines and the word lines;
a sense amplifier connected to one or more of the bit lines and configured to sense data stored in the memory cells; and
a word line driver configured to control voltages of one or more of the word lines, wherein
a plurality of the memory cells constitute a memory block, the memory block being a unit of memory cells on which a data erasing operation is performed, and the memory cells commonly connected to each of the word lines constitute a page in the memory block, and
the semiconductor storage device further comprises a control part configured to change an erase condition during the data erasing operation performed on the memory block or a verify condition for a verify check of verifying whether the data has been erased from the memory cells in the memory block, in proportion to a ratio of number of predetermined logical value data to the data in the memory block or the page before the data erasing operation.

2. The device of claim 1, wherein
when a ratio of data indicating a charge accumulated state to the data in the memory block or the page before the data erasing operation exceeds a predetermined value, the control part sets a reference voltage compared with a voltage of each of the bit lines during the verify check to a first reference voltage, the reference voltage being compared with a voltage of each of the bit lines during the verify check, and
when the ratio of the data indicating the charge accumulated state is equal to or lower than a predetermined value, the control part sets the reference voltage to a second reference voltage which is higher than the first reference voltage.

3. The device of claim 1, wherein
the memory cells in the memory block are present on a same well in a semiconductor substrate,
when a ratio of data indicating a charge accumulated state to the data in the memory block or the page before the data erasing operation exceeds a predetermined value, the control part sets a well voltage to a first well voltage, the well voltage being applied to the well during the data erasing operation, and
when the ratio of the data indicating the charge accumulated state is equal to or lower than a predetermined value, the control part sets the well voltage to a second well voltage which is higher than the first well voltage.

4. The device of claim 2, wherein
the memory cells in the memory block are present on a same well in a semiconductor substrate,
when a ratio of data indicating a charge accumulated state to the data in the memory block or the page before the data erasing operation exceeds a predetermined value, the control part sets a well voltage to a first well voltage, the well voltage being applied to the well during the data erasing operation, and
when the ratio of the data indicating the charge accumulated state is equal to or lower than a predetermined value, the control part sets the well voltage to a second well voltage which is higher than the first well voltage.

5. The device of claim 1, wherein when a ratio of data indicating a charge accumulated state to the data in the memory block or the page before the data erasing operation is equal to or lower than a predetermined value, the control part performs the verify check after the data erasing operation and then performs again the data erasing operation.

6. The device of claim 2, wherein when a ratio of data indicating a charge accumulated state to the data in the memory block or the page before the data erasing operation is equal to or lower than a predetermined value, the control part performs the verify check after the data erasing operation and then performs again the data erasing operation.

7. The device of claim 3, wherein when a ratio of data indicating a charge accumulated state to the data in the memory block or the page before the data erasing operation is equal to or lower than a predetermined value, the control part performs the verify check after the data erasing operation and then performs again the data erasing operation.

8. The device of claim 4, wherein when a ratio of data indicating a charge accumulated state to the data in the memory block or the page before the data erasing operation is equal to or lower than a predetermined value, the control part performs the verify check after the data erasing operation and then performs again the data erasing operation.

9. The device of claim 1, wherein
when a ratio of data indicating a charge accumulated state to the data in the memory block or the page before the data erasing operation exceeds a predetermined value, the control part sets a time required to sense the voltage of one of the bit lines during the verify check to a first sense time, and
when the ratio of the data indicating the charge accumulated state is equal to or lower than a predetermined value, the control part sets the time required to sense the voltage of one of the bit lines during the verify check to a second sense time which is shorter than the first sense time.

10. The device of claim 2, wherein
when a ratio of data indicating a charge accumulated state to the data in the memory block or the page before the data erasing operation exceeds a predetermined value, the control part sets a time required to sense the voltage of one of the bit lines during the verify check to a first sense time, and
when the ratio of the data indicating the charge accumulated state is equal to or lower than a predetermined value, the control part sets the time required to sense the voltage of one of the bit lines during the verify check to a second sense time which is shorter than the first sense time.

11. The device of claim 3, wherein
when a ratio of data indicating a charge accumulated state to the data in the memory block or the page before the data erasing operation exceeds a predetermined value, the control part sets a time required to sense the voltage of one of the bit lines during the verify check to a first sense time, and
when the ratio of the data indicating the charge accumulated state is equal to or lower than a predetermined value, the control part sets the time required to sense the voltage of one of the bit lines during the verify check to a second sense time which is shorter than the first sense time.

12. The device of claim 4, wherein
when a ratio of data indicating a charge accumulated state to the data in the memory block or the page before the data erasing operation exceeds a predetermined value, the control part sets a time required to sense the voltage of one of the bit lines during the verify check to a first sense time, and
when the ratio of the data indicating the charge accumulated state is equal to or lower than a predetermined value, the control part sets the time required to sense the voltage of one of the bit lines during the verify check to a second sense time which is shorter than the first sense time.

13. The device of claim 5, wherein
when a ratio of data indicating a charge accumulated state to the data in the memory block or the page before the data erasing operation exceeds a predetermined value, the control part sets a time required to sense the voltage of one of the bit lines during the verify check to a first sense time, and
when the ratio of the data indicating the charge accumulated state is equal to or lower than a predetermined value, the control part sets the time required to sense the voltage of one of the bit lines during the verify check to a second sense time which is shorter than the first sense time.

14. The device of claim 1, wherein the device is NAND-type flash memory device.

\* \* \* \* \*